(12) United States Patent
Mori

(10) Patent No.: US 6,670,796 B2
(45) Date of Patent: Dec. 30, 2003

(54) ULTRA FAST AND HIGH EFFICIENCY INDUCTIVE COIL DRIVER

(75) Inventor: Eiji Mori, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 10/154,642

(22) Filed: May 24, 2002

(65) Prior Publication Data

US 2003/0218451 A1 Nov. 27, 2003

(51) Int. Cl.[7] .............................................. H03K 17/687
(52) U.S. Cl. ...................... 323/282; 327/108; 327/110; 307/270; 307/571
(58) Field of Search .......................... 323/282; 327/108, 327/110; 307/270, 571

(56) References Cited

U.S. PATENT DOCUMENTS

| | | | | |
|---|---|---|---|---|
| 3,947,776 A | * | 3/1976 | Stevens et al. ............. | 327/374 |
| 4,661,766 A | * | 4/1987 | Hoffman et al. ............ | 323/287 |
| 5,126,647 A | * | 6/1992 | Blackburn et al. .......... | 318/599 |
| 5,338,977 A | * | 8/1994 | Carobolante ................ | 327/110 |
| 6,351,162 B1 | * | 2/2002 | Schwartz .................... | 327/110 |
| 6,507,177 B2 | * | 1/2003 | Flock et al. ................ | 323/285 |

* cited by examiner

Primary Examiner—Bao Q. Vu
(74) Attorney, Agent, or Firm—Fliesler Dubb Meyer & Lovejoy LLP

(57) ABSTRACT

A circuit for driving an inductive load includes a high frequency driver and low frequency driver. A low frequency component and a high frequency component is taken from an input signal. The separate low and high signal components are driven by a low frequency driver and high frequency driver, respectively. The outputs of the low frequency and high frequency drivers are combined by combination circuitry. The high frequency component is amplified by the combination circuitry in addition to being combined. The output of the combination circuitry drives an inductive load at fast speeds. The driver circuit of the present invention may be configured to provide low noise at low frequencies, pass band limitations at the load terminal, different AC and DC open loop gains, and other characteristics depending upon system requirements.

43 Claims, 10 Drawing Sheets

ULTRA FAST AND HIGH EFFICIENCY INDUCTIVE COIL DRIVER

FIELD OF THE INVENTION

The present invention relates to driver circuits. More particularly, the present invention relates to driver circuits with an inductive load.

BACKGROUND

Current driver circuits and other driver circuits are generally known and used for many applications. A basic current driver circuit 100 of the prior art is shown in FIG. 1. The driver circuit 100 has a signal input 105. The signal input 105 is connected to the positive terminal of amplifier 115 and to one end of resistor R1 110. The other end of resistor 110 is connected to ground. The output of amplifier 115 is connected to one end of driver resistor 120. The other end of resistor 120 is connected to the base of transistor 125. The negative terminal of amplifier 115 is connected to the emitter of amplifier 125 and to one end of current sensor resistor 140. The other end of resistor 140 is connected to ground. A voltage source 130 is connected to one end of an inductance load 135. The other end of the inductance load 135 is connected to the collector of transistor 125.

In operation, transistor 125 of the current driver sinks a current through the inductive load 135. Signal input 105 applies input signal $v_i$ to the positive terminal of amplifier 115 and to resistor 110. The voltage at the negative terminal of amplifier 115 is approximately equal to the voltage applied to the positive terminal of the amplifier. The voltage at the emitter of the transistor is applied to the negative terminal of the amplifier, which in turn sets the voltage at the base of the transistor. In one embodiment, the voltage at the base of the transistor is approximately 0.7 volts more than the emitter. Assuming operation in the active state for transistor 125, when the input signal $v_i$ is low, a voltage difference is applied across resistor 120 inducing a base current $i_B$. When the base current $i_B$ is induced at the base, a current $i_C$ is induced at the collector whereby $i_B=((1-\alpha)/\alpha)* i_C$, where $\alpha$ is a constant for the particular transistor. The collector current $i_C$ drives the inductive load 135. When the input signal $v_i$ goes high, the voltage difference across resistor 120 increases and induces a larger current $i_B$. This induces a larger $i_C$ current to flow through the inductive load 135.

The current response to driver circuit 100 is shown in FIG. 2 and displays several disadvantages of drive circuit 100. As shown in FIG. 2, the driver circuit 100 displays a slow rise time and a slow recovery time. A faster rise time can be achieved by increasing the amplifier supply voltage 130. However, increasing the supply voltage results in decreasing the efficiency of the driver circuit. The current response of FIG. 2 also displays a large negative spike voltage characteristic. Such a negative spike voltage of the driver circuit 100 may damage the drive transistor unless a capacitor or diode is used to eliminate it.

Another type of driver of the prior art is a current push/pull driver. A basic current push/pull driver circuit 300 is shown in FIG. 3. An input signal is connected to resistor 310 and the positive terminal of driving amplifier 315. The output of amplifier 315 is applied to one terminal of resistor 320 and inductive load 330. The negative terminal of the amplifier 315 is connected to the other terminal of resistor 320, inductive load 330, and to one terminal of current sensing resistor 325. The other terminal of current sensing resistor 325 is connected to ground.

In operation, the signal input 305 applies signal $v_i$ to resistor 310 and to the positive terminal of driving amplifier 315. The output of the amplifier 315 is applied to one end of resistor 320 and one end of the inductive load 330. The voltage at the negative terminal of driving amplifier 315 is approximately the same as the voltage at the positive terminal of driving amplifier 315. The voltage at the negative terminal of the drive amplifier applies a voltage to one terminal of current sensing resistor 325. The voltage difference across current sensing resistor 325 induces a current through resistor 325 towards the grounded terminal of the resistor and through resistor 320 towards resistor 325. Resistor values for resistor 320 and 325 are chosen such that the current driven through resistor 325 will be more or less than the current through resistor 320 depending on whether the input signal goes high or low. When input signal $v_i$ is low, the voltage difference across resistor 320 induces a current across resistor 320 towards node 340. This provides a current across resistor 320 smaller than the current drawn by current sensor resistor 325. As a result, current is pushed through inductor 330 towards node 340. When input signal $v_i$ is high, the voltage difference placed across resistor 320 is now higher then when $v_i$ was low and higher than the current drawn by current resistor 325 away from node 340. As a result, current is pulled through inductor 330 away from node 340.

The current response of the push/pull driver circuit 300 is shown in FIG. 4. The current response of circuit 300 is improved over the current response of circuit 200. The negative spike voltage characteristic has been eliminated due to the push/pull characteristic of circuit 300. The push/pull operation to the inductive load operates to remove some of the energy stored in the inductive load. Current driver 300 still possess a slow rise time characteristic is shown in FIG. 4. Though the rise time of circuit 300 could be improved by increasing the supply voltage, this would decrease efficiency and require additional elements such as heat sink components.

What is needed is an improved circuit for driving an inductive load. The circuit should generate a high enough voltage to drive an inductive load at high speeds and display a favorable rise time. Further, a driving circuit is needed that can provide a low level of noise, high frequency capability, and be otherwise configurable to meet different system requirements as needed.

SUMMARY

A driving circuit for driving an inductive load in accordance with the present invention includes a high frequency driver and low frequency driver. A low frequency component and high frequency component is taken from an input signal. The separate low and high signal components are input to a low frequency driver and high frequency driver, respectively. The outputs of the high frequency and low frequency drivers are combined by combination circuitry. In one embodiment of the present invention, the high frequency component is also amplified by the combination circuitry. The combined signals generate a high voltage signal that drives an inductive load at fast speeds. The driver circuit of the present invention may be configured to provide low noise at low frequencies, pass band frequency response at the load terminal, different AC and DC open loop gains, and other characteristics depending upon system requirements.

DETAILED DESCRIPTION

A driving circuit for driving an inductive load in accordance with the present invention includes a low frequency driver, one or more high frequency drivers, and combination circuitry. A low frequency component and high frequency component are taken from an input signal. The separate low and high signal components are input to a low frequency driver and high frequency driver, respectively. The outputs of the low frequency and high frequency drivers are combined by combination circuitry. In one embodiment of the present invention, the high frequency component is amplified by the combination circuitry in addition to being combined. The combined signals generate a high voltage signal that drives an inductive load at fast speeds. The driver circuit of the present invention may be configured to provide low noise at low frequencies, pass band frequency response at the load terminal, different AC and DC open loop gains, and other characteristics depending upon system requirements.

High frequency amplifiers, such as amplifiers over 4 kHz, generally are used in amplifier circuits having lower resistor values. As a result of the lower resistance values, the open loop gain is lower and current accuracy is decreased. A fast amplifier normally requires higher current and resistors having higher values. The higher resistance values are generally associated with poor noise performance. Thus, a trade-off is usually made between circuit speed and noise.

The present invention addresses the trade-off requirement by generating a different circuit topology for the two amplifiers. Inductive load applications do not require high speed and low noise performance simultaneously. Thus, a high gain, low noise, slow speed amplifier is used as a low frequency amplifier and moderate gain, moderate noise, fast speed amplifier is used as a high frequency amplifier. As a result, the present invention embodies a higher performance inductive driver circuit.

Figure 1:
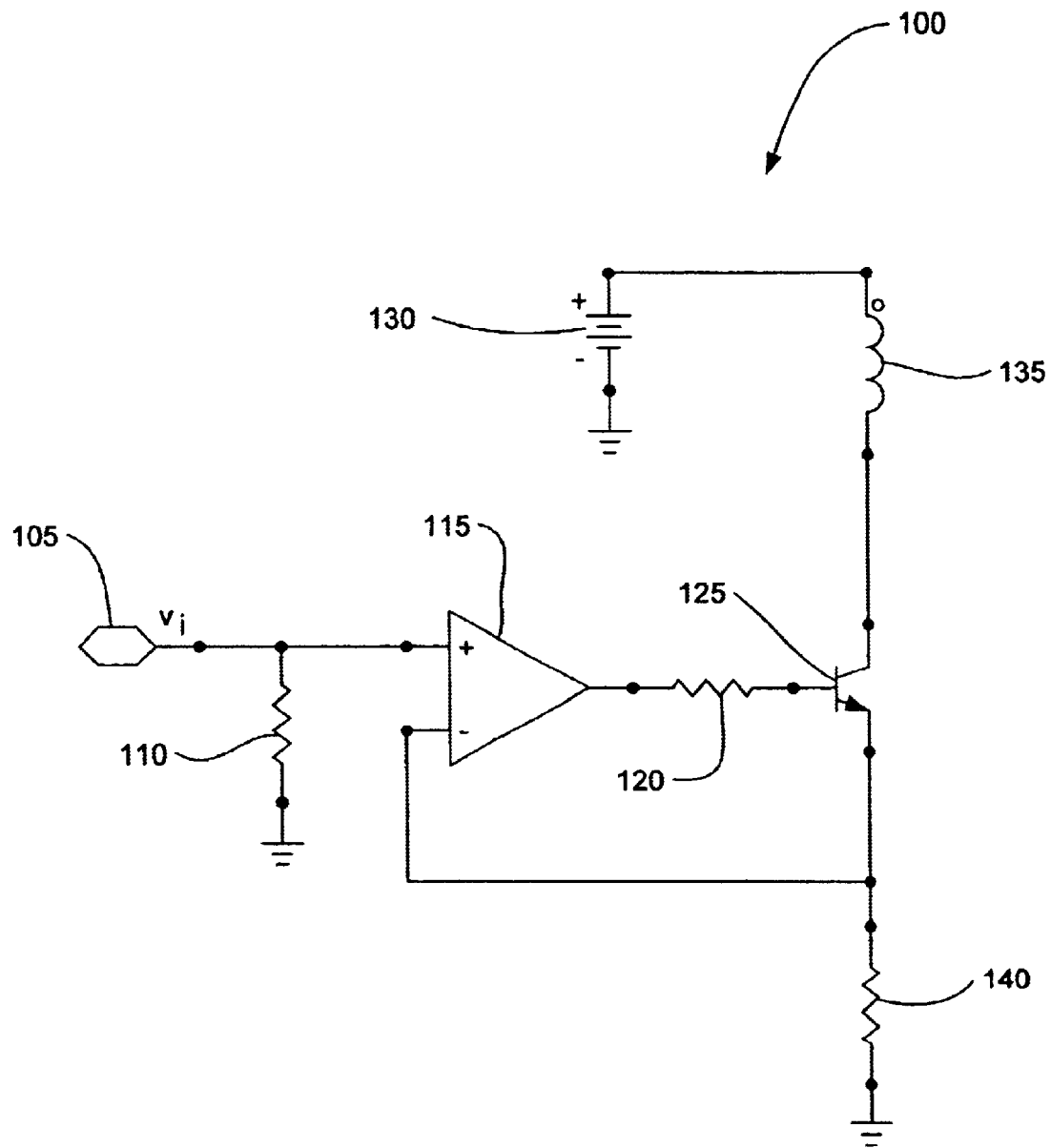
FIG. 1 is a diagram of a typical inductance current driver circuit of the prior art.
Figure 2:
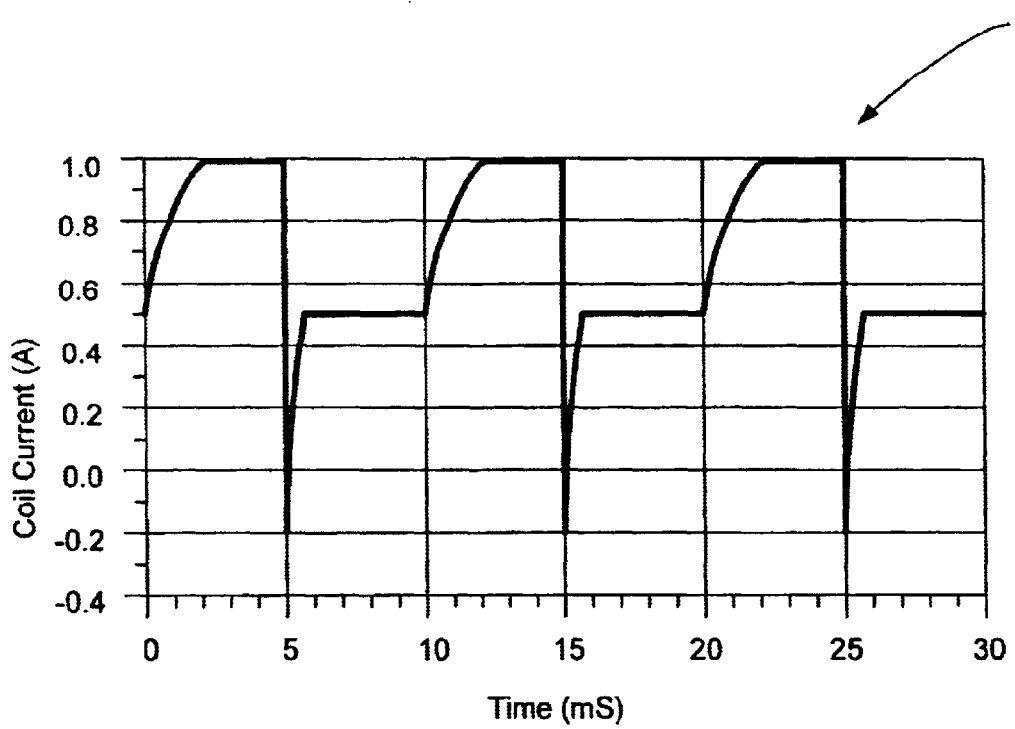
FIG. 2 is a diagram of the driver current response of the driver circuit of FIG. 1.
Figure 4:
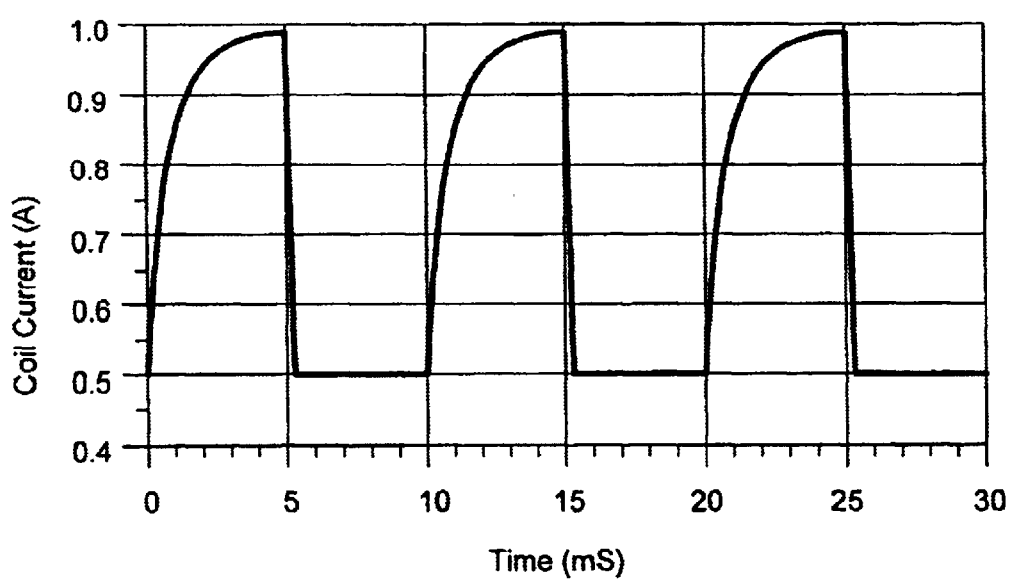
FIG. 4 is a diagram of the driver current response of the push/pull driver circuit of FIG. 3.
Figure 3:
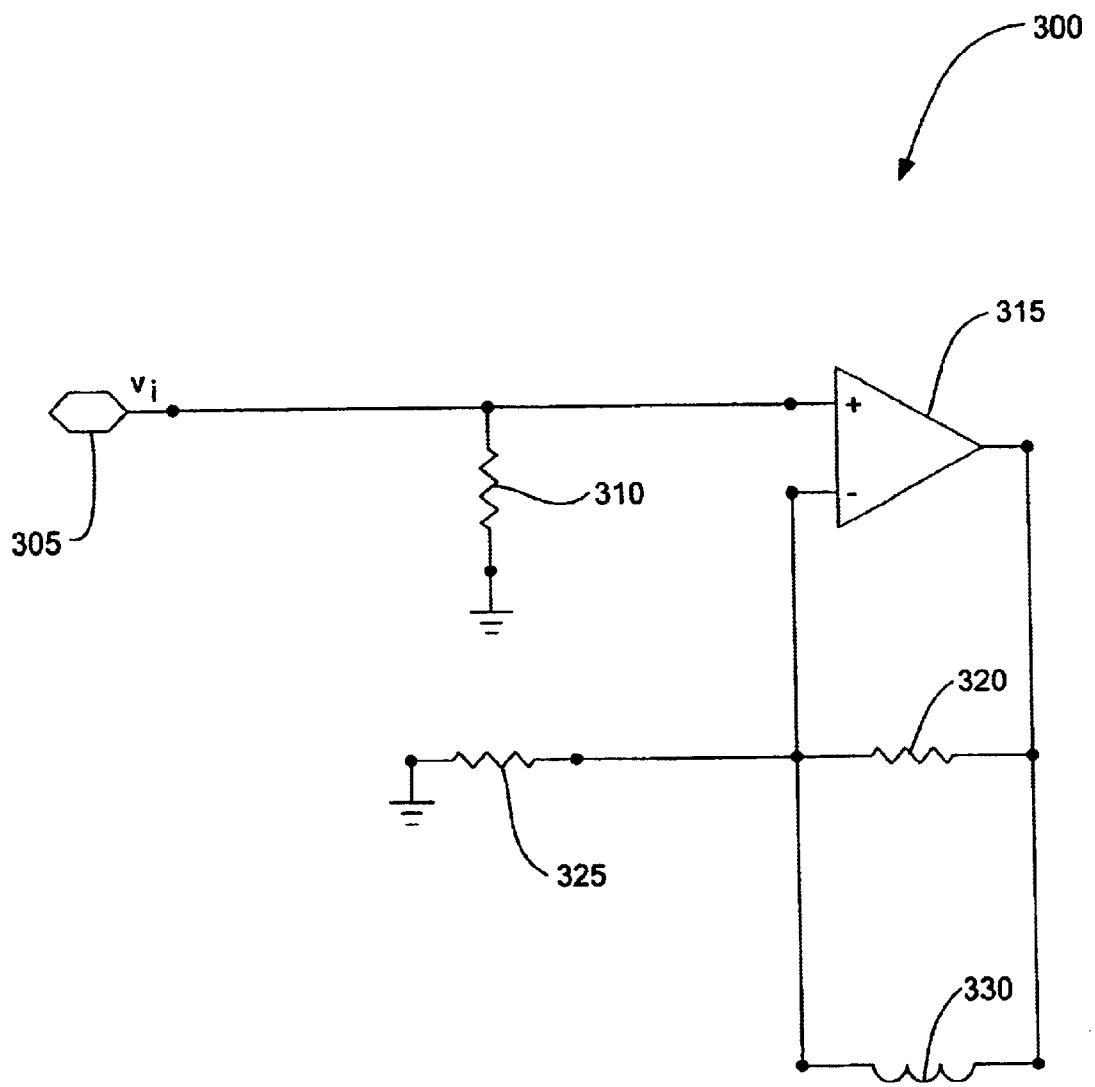
FIG. 3 is a diagram of a typical inductance current push/pull driver circuit of the prior art.
Figure 5:
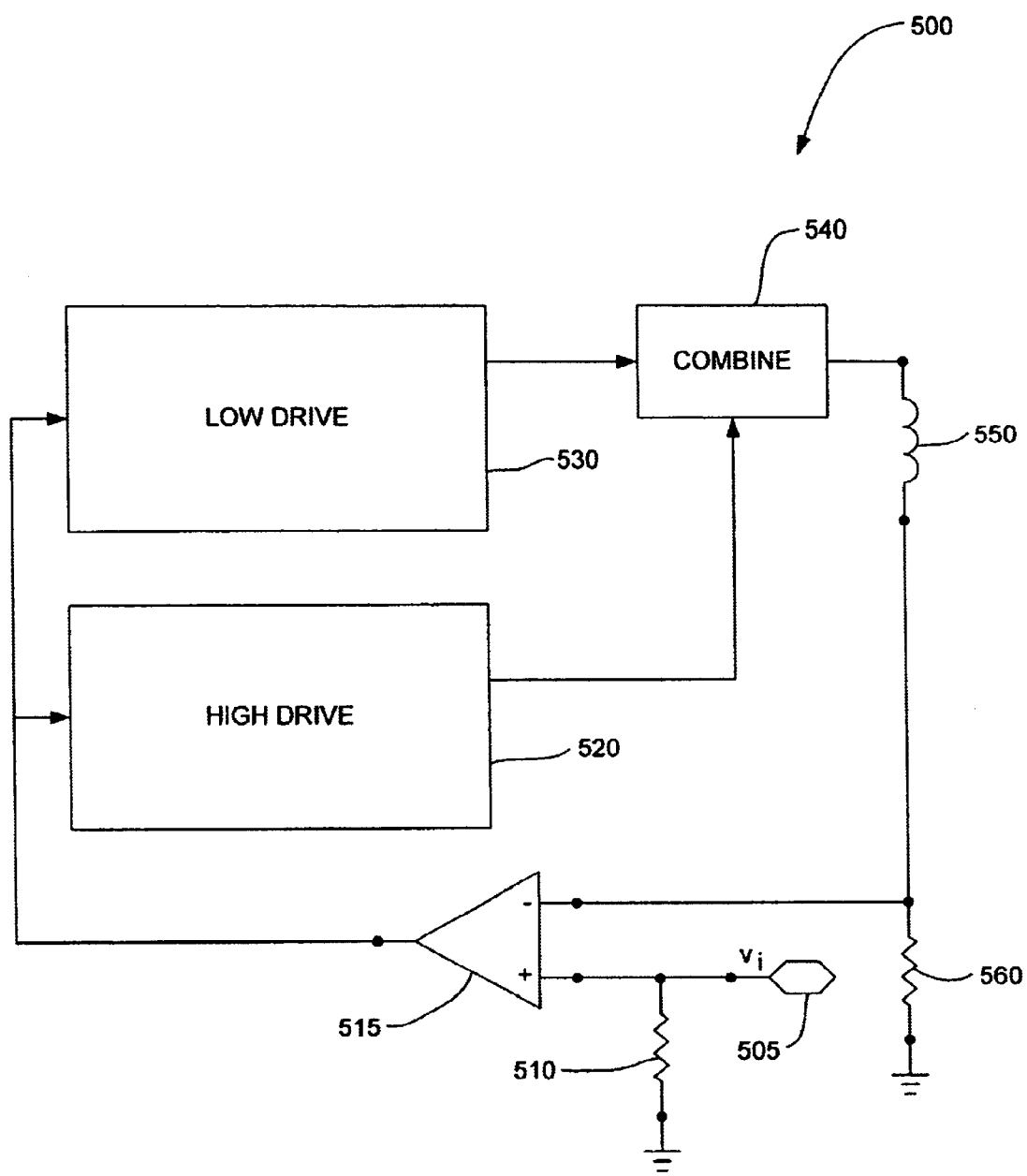
FIG. 5 is a diagram of a inductance driver circuit in accordance with one embodiment of the present invention.

A driving circuit 500 for an inductive load in accordance with the present invention is shown in FIG. 5. As shown in FIG. 5, driving circuit 500 includes a signal input 505 connected to resistor 510 and the positive terminal of amplifier 515. The output of amplifier 515 is connected to high frequency driver 520 and a low frequency drive circuit 530. The outputs of the low frequency and high frequency drivers are input into combining circuitry 540. The output of combining circuitry 540 drives the inductive load 550. The inductive load 550 is coupled to current sense resistor 560 and the negative terminal of amplifier 515. The other end of the current sensing resistor is connected to ground.

In operation, the reference signal input applies reference signal $v_i$ to resistor 510 and amplifier 515. An amplified signal is then output from the amplifier and applied to the input of high frequency driver 520 and low frequency driver 530. In one embodiment, the amplified signal contains different frequency components. Low frequency components of the spectrum are processed by a low frequency amplifier and high frequency components of the spectrum are processed by a high frequency amplifier or are otherwise suppressed by filters. The high frequency driver 520 is configured to drive the high frequency portion of input signal $v_i$. If a signal contains mostly high frequency components, then perhaps 60–90% of the signal may be processed by the high frequency driver. In one embodiment, the high frequency driver may include a high pass or band pass filter in order to separate the desired frequency signal from the input signal $v_i$. In another embodiment, the high frequency driver may include a low pass filter and an amplifier using negative feedback circuits. The high frequency driver may also include amplifier circuitry to amplify the high frequency portion as needed. The high frequency driver outputs the high frequency component into combining circuitry 540. The low frequency driver is configured to drive the low frequency component of the input signal $v_i$. In one embodiment, if the input signal $v_i$ has a slow rise time, then a larger portion of input signal $v_i$ may be processed by the low frequency driver. The low frequency driver may include a low pass filter or other type of filter depending on the circuit topology. In general, the low frequency driver circuitry will have a frequency response having a low pass characteristic shape to retrieve the desired DC and/or low frequency signal from the input signal. The low frequency driver may also include amplifier circuitry to amplify the low frequency portion as needed. The output of the low frequency driver is provided to combining circuitry 540. The combining circuitry combines the low and high frequency components and provides an output signal or driving signal having an output signal voltage better shaped to drive inductive load 550. A current is driven through inductive load 550 as determined by the difference between the combining circuitry output voltage and the voltage at the current sensor resistor.

Figure 6:
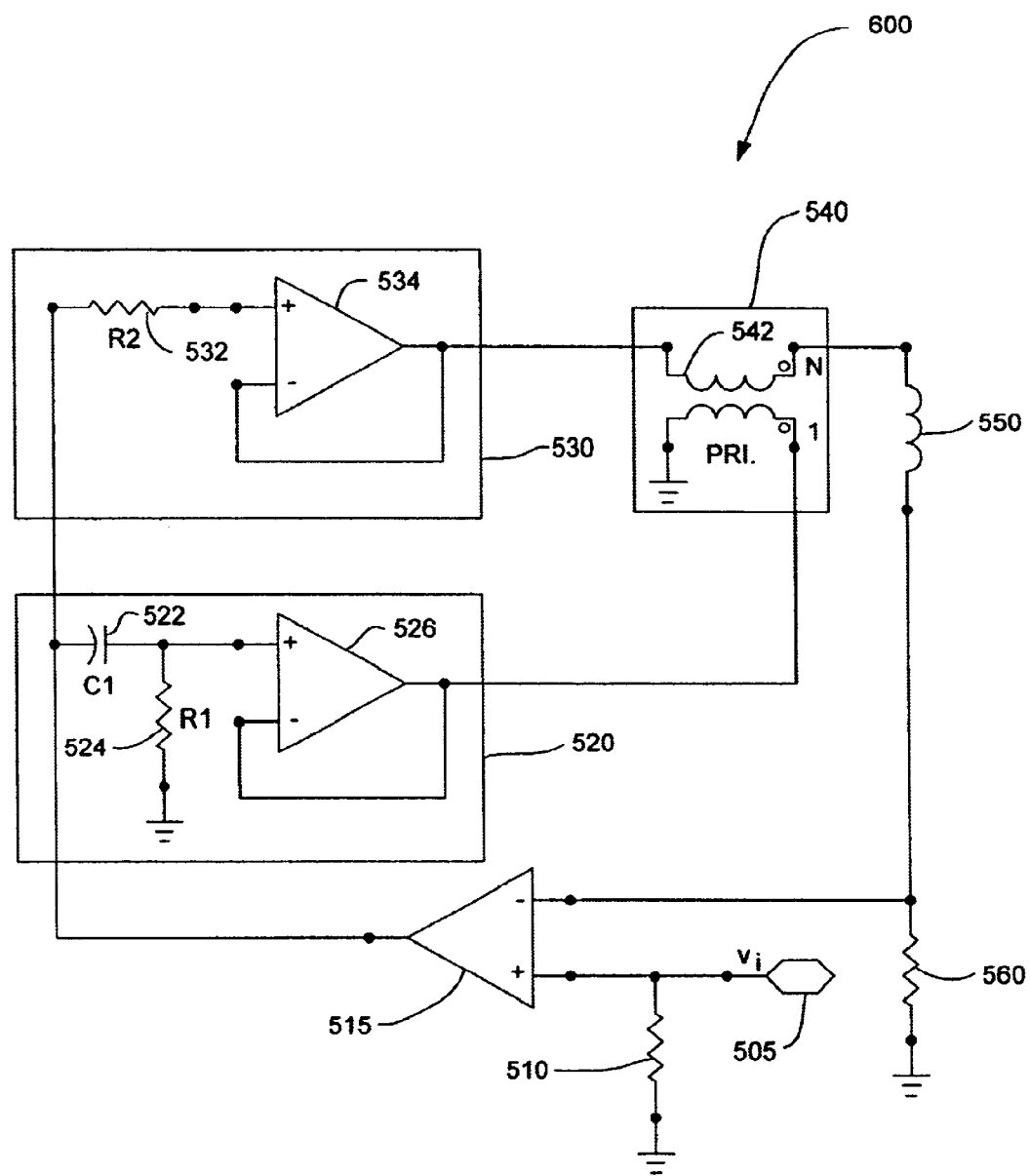
FIG. 6 is a diagram of an inductance driver circuit with low frequency and high frequency circuitry in accordance with one embodiment of the present invention.

A driver circuit 600 with low frequency drive circuitry, high frequency drive circuitry, and combining circuitry in accordance with one embodiment of the present invention is shown in FIG. 6. In FIG. 6, high frequency drive circuitry 520 includes a capacitor 522, resistor 524, and amplifier 526. In the embodiment shown, capacitor 522 and resistor 524 act as a high pass or band pass RC filter to allow certain frequencies above DC to pass. In another embodiment, a band pass filter allows frequencies between 1 kHz and 4 kHz to pass through to amplifier 534. Those skilled in the art will understand that the band pass range will vary depending on the particular circuit requirements. The scope of the current invention is not intended to be limited by the band pass range of the high drive circuitry. The band pass circuitry then provides a signal to the positive terminal of amplifier 526.

The amplifier could be configured as a non-inverting amplifier to amplify the signal as shown or act as a buffer for the signal depending on system requirements. Low frequency drive circuitry 530 includes a resistor 532 and an amplifier 534. The amplifier 534 in conjunction with the inductive load 550 and 542 act as a low pass circuit.

In general, a rapid change in the current through the inductive load requires a higher voltage supply to amplifier 534. A limited power supply for amplifier 534 effects the current supply to the inductive load. Applying a high frequency component to an amplifier with a limited voltage power supply will not produce a voltage higher than the voltage supply. Thus, from Ohm's law (V=IR), the limitation of the bandwidth will be determined by the inductance value of the inductors and the power supply voltages. Thus, if an input signal to an amplifier exceeds a certain value, the frequency response will be lost. This characteristic is the low pass filter response. Normally, the bandwidth of amplifier 534 and 526 are wider than the cross over frequency of the system. The frequency response may not be wider if inductive loads are located at the amplifier output.

The low pass signal in circuit 530 is applied to the positive terminal of amplifier 534. The amplifier could be configured as a non-inverting amplifier to amplify the signal as shown or act as a buffer for the signal depending on system requirements in FIG. 6.

In accordance with the embodiment of the present invention shown in FIG. 6, the outputs of the high frequency drive and low frequency drive circuits are combined using a transformer 542. In FIG. 6, the low frequency driver applies a signal to the secondary coil of the transformer. The high frequency driver applies a signal to the primary coil of the transformer. In the embodiment shown in FIG. 6, the primary coil has fewer wire turns than the secondary coil. The transformer acts to combine the signals and amplify the high frequency component according to the transformer ratio N to 1 as shown. The voltage $V_{LOAD}$ at the output of the combining circuitry 540 and applied to the inductive load 550 can be described as $$V_{LOAD} = V_{LD} + V_{PC} + V_1,$$

where $V_{LD}$ is the voltage output of the low frequency drive circuit, $V_{PC}$ is the voltage increase (or decrease) at the secondary coil, and $V_1$ is the voltage induced from the secondary side of the transformer. The voltage increase at the secondary coil can be described as $V_{PC} = L(di_{LD}/dt)$ where L is the inductance of the coil and $i_{LD}$ is current output of the low frequency driver. The induced voltage $V_1$ can be described as $V_1 = M(di_{HD}/dt)$, where M is the mutual inductance of the transformer and $i_{HD}$ is the current output from the high frequency driver circuit applied to the primary coil of the transformer. The mutual inductance M may be derived from the transformer ratio, which is chosen according to the requirements of the system. In this case, the transformer may have a ratio of 5 to 1, 10 to 1, 20 to 1, or some other ratio.

The transformer ratio can be changed dynamically in accordance with the present invention depending on the requirements of the system. A lower ratio transformer operates at a lower current and a lower speed. A transformer with a higher ratio may operate more quickly or over a wider frequency band, but requires a higher current. Different transformer ratios may be used depending on the system in which the inductance driver is implemented in. Such implementations are hereby considered within the scope of the present invention.

The current induced through the inductive load 550 is determined by the difference between the load voltage and the current sensor voltage. As shown, current sense resistor 560 is connected between one end of load 550 and a ground terminal. The load voltage may be determined by transformer 542 as discussed above. The current sensor voltage of circuit 600 is determined by the inductive load current through current sense resistor 560.

Figure 7:
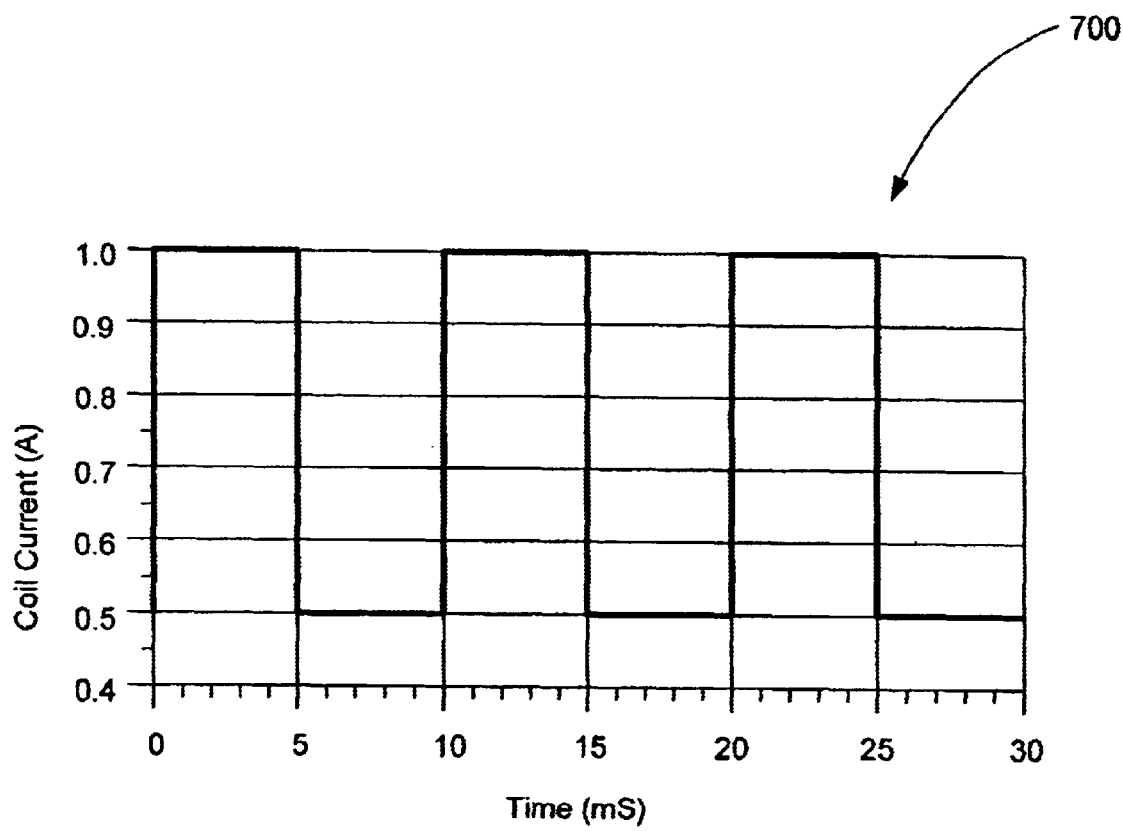
FIG. 7 is a diagram of the driver current response of the driver circuit of FIG. 6.

An advantage of the circuit of FIG. 6 is that amplifier 526 of the high frequency driver may be used to drive a high current without using a higher voltage output amplifier. Amplifier 526 is only required to drive the transformer 542 and may operate at lower power supply voltage levels. In contrast to amplifier 526, amplifier 534 can be a medium current and medium voltage amplifier. Amplifier 534 may also be chosen to have low noise characteristics because it does not require a higher current. The performance of amplifier 534 determines the DC and low frequency performance that is important in phase locked loops. The current response of the driver circuit of FIG. 6 is shown in FIG. 7. The current response is improved over systems of the prior art in that the rise time, negative spike voltage, and recovery time characteristics are all improved over the current response of drive circuits 100 and 300 of the prior art.

Another advantage of the inductance driver circuit of the present invention is that the circuit does not require a high current at all times. The primary side of the transformer is driven using current. For a short time, the higher current is used to generate a higher voltage on the secondary side of the transformer. The higher current is only needed when the coil current is changing rapidly. In one embodiment of the present invention, the input signal may be a burst wave form. Thus, the high current is only needed for a short time when a burst appears in the signal. In one embodiment, a capacitor may be used to store power and supply current to the high frequency amplifier. Thus, the power supply only needs to drive an average current load. In this embodiment of the present invention, a high current power supply is not needed.

Figure 8:
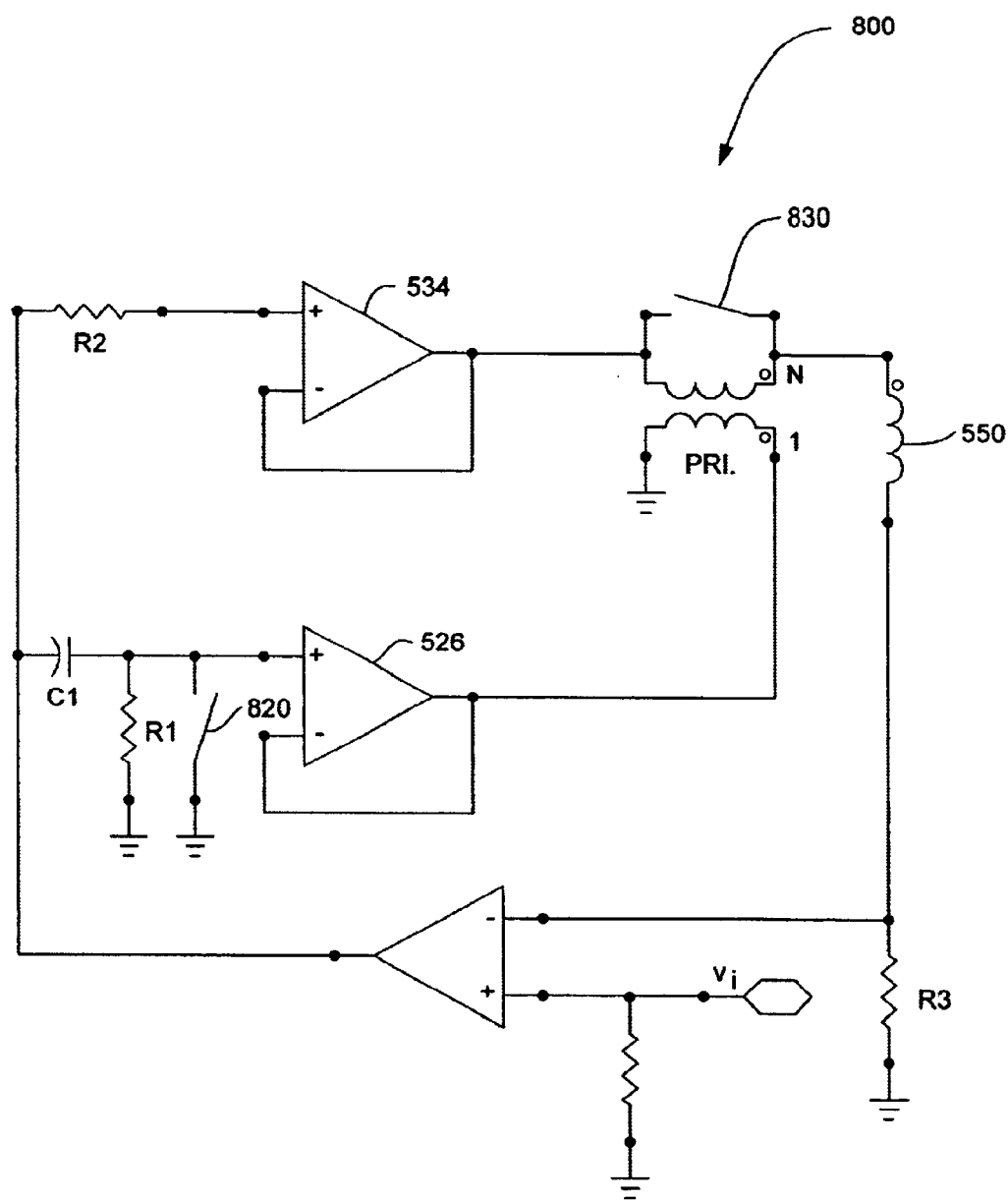
FIG. 8 is a diagram of a low noise inductance driver circuit in accordance with one embodiment of the present invention.

The circuit of FIG. 6 may be manipulated into many configurations to meet the requirements of different systems. A few examples of the many possible configurations are shown in FIGS. 8–11. In FIG. 8, a driver circuit 800 is shown for systems that require low noise in accordance with one embodiment of the present invention. Most of the noise introduced in the inductive load is from the high frequency driver. Switches may be used to reduce the noise introduced by the high frequency driver. As shown in FIG. 8, switches may be used in the high frequency driver circuitry and the combining circuitry. When the high pass driver circuitry switch 820 is in the closed position, a short is created between the positive terminal of amplifier 526 and ground. The short created by switch 820 prevents a significant portion of the high frequency signal from being applied to amplifier 526. When the combining circuitry switch 830 is in the closed position, a short is created between the output of amplifier 534 and inductive load 550. The short created by switch 830 prevents a significant portion of the signal output from the high pass driver circuit from being combined with the low pass driver circuit. When the switches are closed, allowing the high frequency signal to proceed, most of the noise introduced to the inductive load is from the high frequency component. Thus, when either one or both of switch 820 and 830 are closed, only a small portion of the high frequency component and corresponding noise element is pushed through the inductive load 550. This allows the circuit to operate with a lower noise floor capability. In one embodiment, at least one of switch 820 or 830 is closed when the input signal is characterized by low frequency energy.

Figure 9:
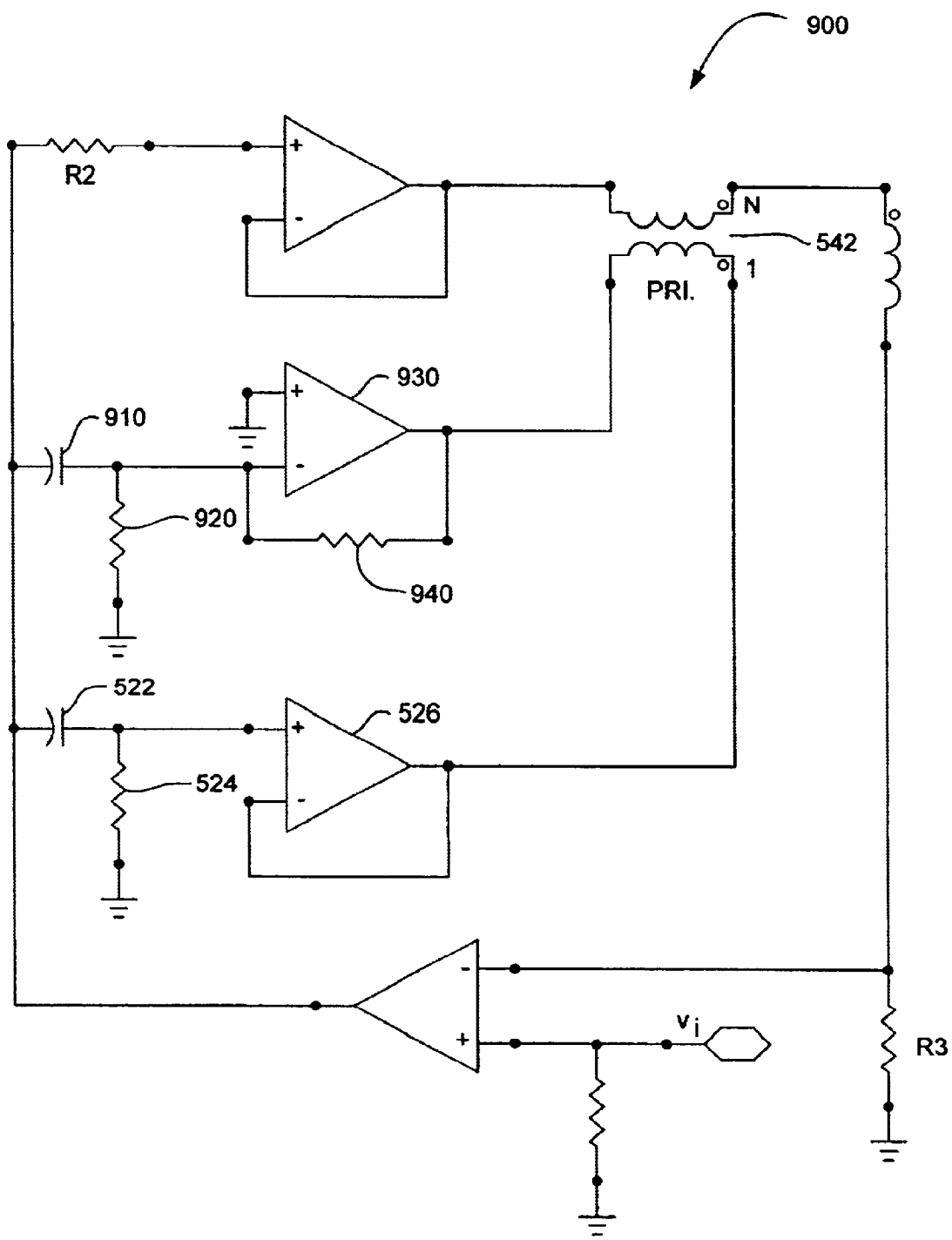
FIG. 9 is a diagram of a inductance driver circuit having an increased efficiency high frequency driver in accordance with one embodiment of the present invention.

Some driver circuit applications may be configured for a more efficient high frequency drive circuit. This may be achieved by using multiple lower voltage amplifiers in the high frequency drive component of the present invention. A driver circuit 900 with a more efficient high frequency drive component in accordance with one embodiment of the present invention is shown in FIG. 9. Circuit 900 of FIG. 9 is similar to circuit 600 of FIG. 6 except for the addition of capacitor 910, resistor 920, amplifier 930, and resistor 940. Capacitor 910 and resistor 920 operate as a high pass RC filter. A high frequency signal is provided from the RC high pass filter to the inverting input of amplifier 930. The non-inverting input is coupled to ground. The output of the inverting amplifier is connected to resistor 940, which is then connected to the inverting input terminal of the amplifier, and to one end of the primary coil of transformer 542. In FIG. 9, a more efficient drive capability is accomplished in the high frequency driver by implementing a balanced terminal load circuit around the primary coil of the transformer. One terminal of the secondary coil is coupled to the output of non-inverting amplifier 526. The other terminal of the secondary coil is connected to the output of inverting amplifier 930. The outputs of amplifiers 930 and 526 are 180° out phase with each other at the secondary coil terminals. As a result, a voltage difference is placed across the secondary coil of transformer 542 using the two amplifiers that is approximately twice as large as the voltage applied across the secondary coil terminals if only one such amplifier were used.

Figure 10:
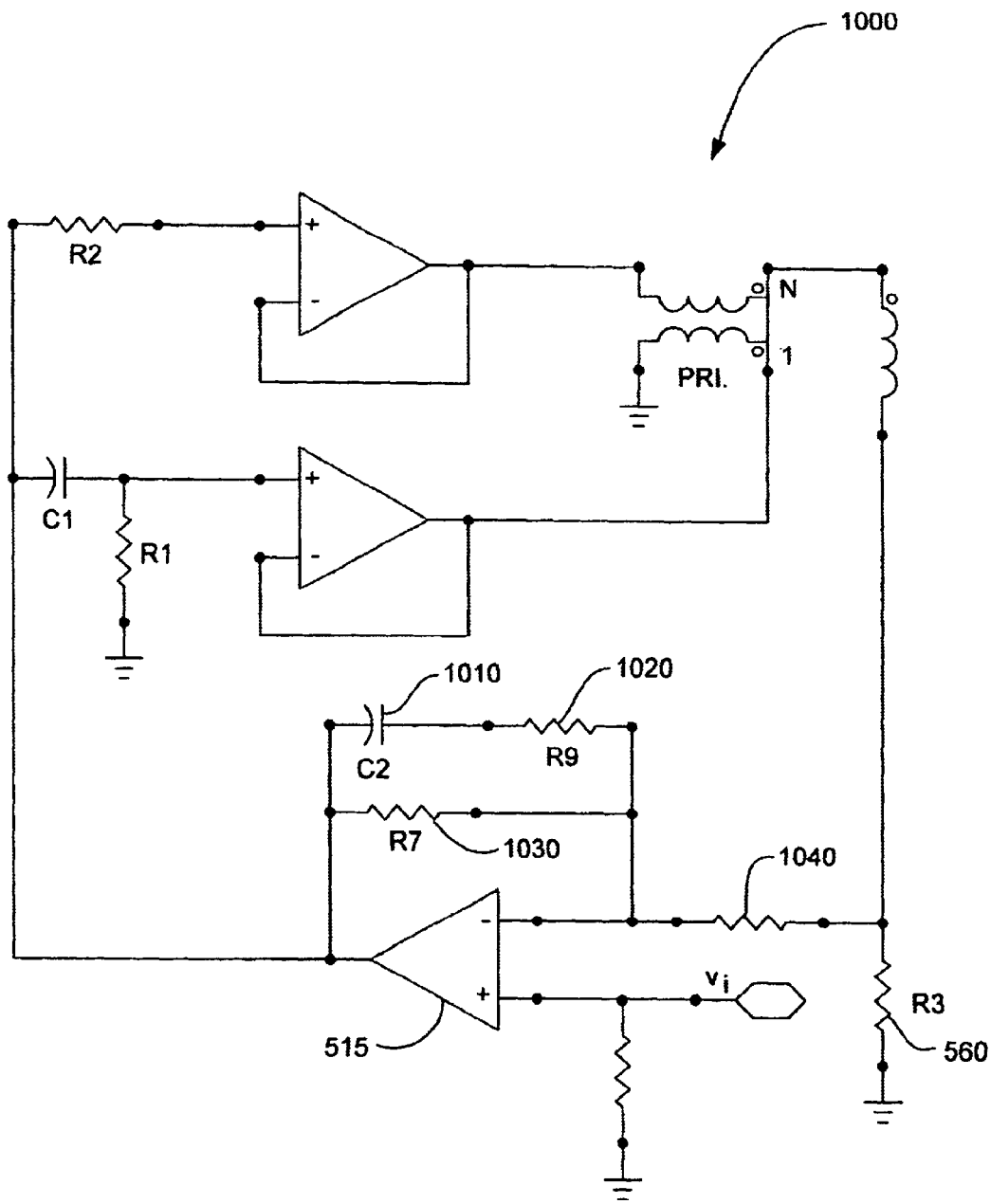
FIG. 10 is a diagram of an inductance driver circuit with a frequency band limiter in accordance with one embodiment of the present invention.
Figure 11:
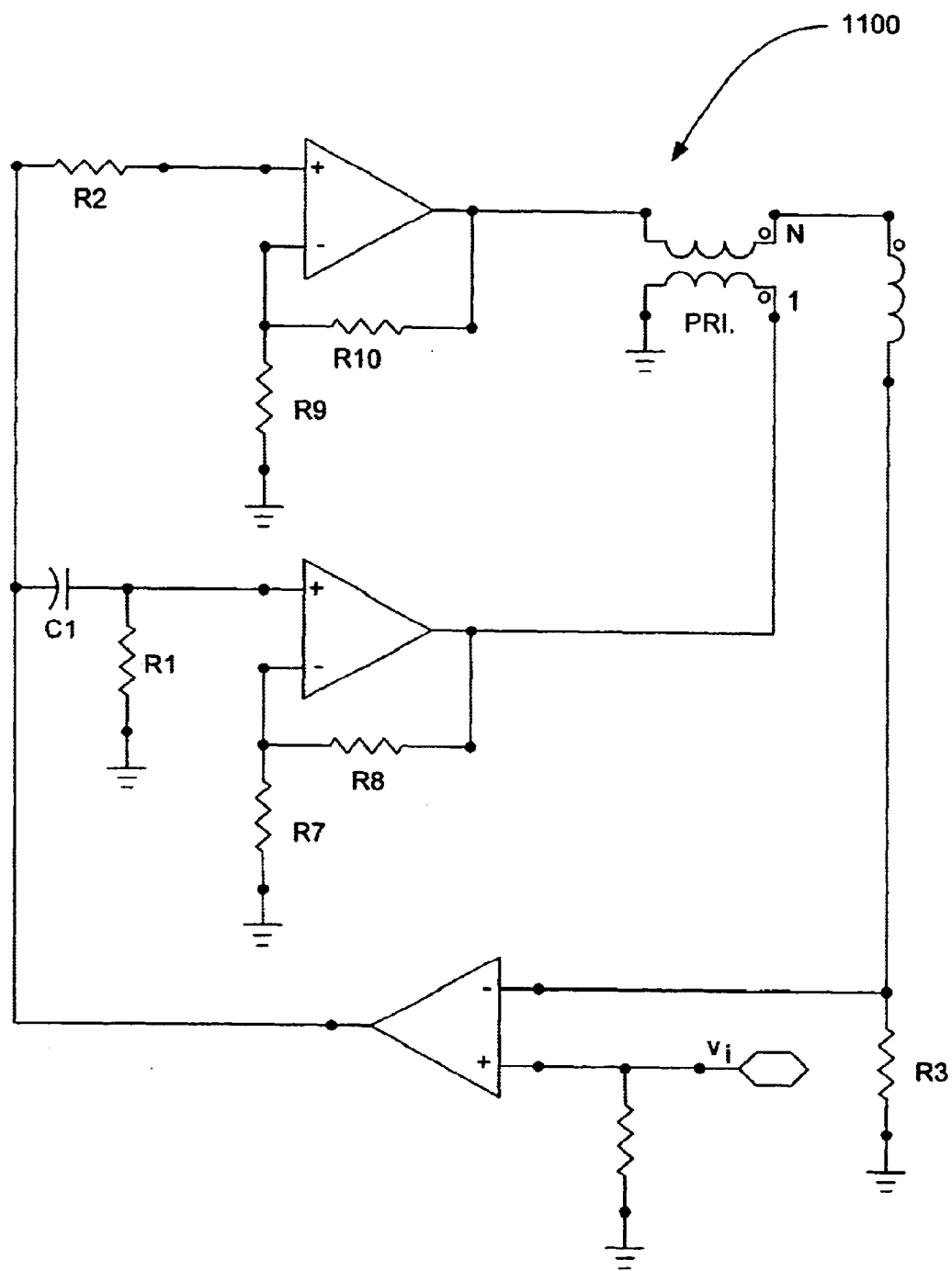
FIG. 11 is a diagram of an inductance driver circuit with a different closed loop gain for a low frequency driver and high frequency driver in accordance with one embodiment of the present invention.

Some driver systems require or may benefit from a frequency band limiter. Band limiting circuitry may operate to suppress high voltage and surge voltages. A driver circuit 1000 implementing a frequency band limitation circuit in accordance with one embodiment of the present invention is shown in FIG. 10. One terminal of resistor 1030 is connected to the output of amplifier 515. The other terminal of resistor 1030 is connected to the negative terminal of amplifier 515. A capacitor 1010 and resistor 1020 are connected in series. The other end of capacitor 1010 is coupled to the output of amplifier 515. The other end of resistor 1020 is coupled to the negative terminal of amplifier 515. Resistor 1040 is coupled between the negative terminal of the amplifier and the current sensor resistor 560. The voltage at the current sensor resistor 560 is determined by the inductive load current and may be limited during a DC signal inputs using resistors 1030 and 1040. During an AC signal input, the voltage at current sensor resistor 560 is determined by resistors 1030 and 1040 and additionally by resistor 1020 and capacitor 1010. In operation, the frequency band limitation circuitry operates as a low pass filter. The frequency band limitation circuitry does not allow a signal above a desired frequency cut-off into the driver circuit. In one embodiment, the desired frequency cut-off is about 10 kHz or 20 kHz. However, those skilled in the art will realize the filter characteristics of circuit 1000 can be adjusted to meet the requirements of a particular system.

The drive circuit of the present invention can be configured to implement a different closed loop gain for the low frequency driver and the high frequency driver. Different closed loop gains can be used to implement gain phase margins that prevent oscillations and establish driver circuit stability. There are many ways to implement a closed loop gain for a driving circuit. High frequency driver and low frequency driver circuit configurations having different closed loop gains in accordance with one embodiment of the present invention are shown in driver circuit 1100 of FIG. 11. The closed loop gain for high frequency driver circuitry in circuit 1100 can be expressed as $V_{OH}=V_{IH}(1+R8/R7)$, where $V_{OH}$ is the output voltage for the high frequency driver amplifier and the $V_{IH}$ is the input voltage to the high frequency driver amplifier. The closed loop gain for low frequency driver circuitry of circuit 1100 can be expressed as $V_{OL}=V_{IL}(1+R10/R9)$, where $V_{OL}$ is the output voltage for the low frequency driver amplifier and the $V_{IL}$ is the input voltage to the low frequency driver amplifier. By adjusting the values of resistors R7, R8, R9, and R10, the closed loop gain can be adjusted for either the low frequency driver amplifier or the high frequency driver amplifier. The open loop gain of both the high frequency and low frequency drive amplifiers may be determined by the particular amplifier circuit topologies and will differ from application to application.

A driving circuit for driving an inductive load in accordance with the present invention includes a high frequency driver and low frequency driver. A high frequency component and low frequency component is taken from an input signal. The separate low and high signal components are driven by a low frequency driver and high frequency driver, respectively. The outputs of the low frequency and high frequency drivers are combined by combination circuitry. In one embodiment of the present invention, the high frequency component is amplified by the combination circuitry in addition to being combined. The combined signals generate a high voltage signal that drives an inductive load at fast speeds. The driver circuit of the present invention may be configured to provide low noise at low frequencies, pass band limitations at the load terminal, different AC and DC open loop gains, and other characteristics depending upon system requirements. Though specific examples of circuit configurations are shown in these FIGS. 8–11, it is not intended to limit the application of the basic invention to these examples. The basic concept of the present invention as shown in FIG. 5 may be applied and modified to meet the designs and specifications of many circuits. The scope of the inductance driver of the present invention is not intended to be limited by the illustrated applications of FIGS. 8–11.

The inductance driver of the present invention may be used in several applications. For example, the inductance driver may be implemented within an electronic measuring instrument, such as a frequency spectrum analyzer. However, the inductance driver could be implemented in any circuit or instrument where an inductive load is to be driven, wherein the circuit or instrument utilizes a low voltage, high speed, and high efficiency inductance driver circuit. Use of the inductance driver of the present invention in larger circuits, instruments, and systems is within the intended scope of the present invention.

Although the present invention has been described above with particularity, this was merely to teach one of ordinary skill in the art how to make and use the invention. Additional modifications will fall within the scope of the invention, as that scope is defined by the following claims.

What is claimed is:

1. A system for driving an inductance load comprising:
    a receiver configured to receive an input signal, the input signal having a high frequency portion and a low frequency portion;
    a high frequency driver configured to process the high frequency portion of the input signal and provide a high frequency output;
    a low frequency driver configured to process a low frequency portion of the input signal and provide a low frequency output; and
    a combining circuitry configured to combine the low frequency output and the high frequency output and provide a combined output signal.

2. The system of claim 1 wherein the combining circuitry is configured to drive a load with the combined output signal.

3. The system of claim 2 wherein the load is an inductive load.

4. The system of claim 2 wherein the load is connected to a current sensing device.

5. The system of claim 1 wherein said high frequency driver includes a high pass filter and an amplifier, the amplifier configured to receive the output of the high pass filter.

6. The system of claim 2 wherein the high pass filter is a high pass RC filter.

7. The system of claim 2 wherein the high pass filter is operable to pass a frequency in the range of about 1 kHz to 4 kHz.

8. The system of claim 1 wherein said low frequency driver includes a low pass filter and an amplifier, the amplifier configured to receive the output of the low pass filter.

9. The system of claim 1 wherein the combining circuitry is a transformer having a primary coil and a secondary coil, the primary coil coupled to the high frequency output, the secondary coil coupled to the low frequency output.

10. The system of claim 1 wherein the high frequency driver includes a noise reducing device operable to reduce the amplitude of the high frequency portion and a noise present within the high frequency signal.

11. The system of claim 10 wherein the noise reducing device includes a switch operable to short the high frequency portion to ground.

12. The system of claim 1 wherein said combining circuitry includes a noise reducing device operable to reduce the proportion of the high frequency output and a noise present within the high frequency output in the combined output signal.

13. The system of claim 12 wherein the noise reducing device includes a switch operable to short the output of the low frequency device.

14. The system of claim 8 wherein said high frequency driver includes:
   a first RC high pass filter coupled to a non-inverting amplifier, the non-inverting amplifier providing a first high frequency output to a first terminal of the primary coil; and
   a second RC high pass filter coupled to an inverting amplifier, the inverting amplifier providing a second high frequency output to a second terminal of the primary coil, the second high frequency output 180° out of phase with the first high frequency output.

15. The system of claim 1 further including:
   an amplifier, said input signal coupled to an input of the amplifier, the output of the amplifier coupled to the high frequency driver and low frequency driver; and
   a frequency band limiter connected to the input and output of the amplifier; the frequency band limiter limiting a voltage applied to the inductive load.

16. The system of claim 1 wherein said high frequency driver includes a first gain circuitry operable to provide a first open loop gain to the high frequency portion, said low frequency driver includes a second gain circuitry operable to provide a second open loop gain to the low frequency portion.

17. A system for driving a load comprising:
   an amplifier operable to receive a signal having a voltage and provide an amplified output;
   a high frequency driver including:
      a high pass filter operable to receive the amplified output and provide a filtered output; and
      a high frequency amplifier operable to receive the filtered output and provide a high frequency driving signal;
   a low frequency driver including:
      a low pass filter operable to receive the amplified output and provide a filtered output; and
      a low frequency amplifier operable to receive the filtered output and provide a low frequency driving signal; and
   a transformer, the low frequency driving signal coupled to the secondary coil of the transformer, the high frequency driving signal coupled to the primary coil of the transformer, said transformer providing a combined output signal.

18. The system of claim 17 wherein the combined output signal is configured to drive an inductive load.

19. A method for driving a load comprising:
   receiving an input signal, the input signal having a high frequency portion and a low frequency portion;
   providing a high frequency driving signal derived from the high frequency portion;
   providing a low frequency driving signal derived from the low frequency portion; and
   driving a load with the high frequency driving signal and the low frequency driving signal.

20. The method of claim 19 wherein driving a load includes driving an inductive load.

21. The method of claim 19 wherein providing a high frequency driving signal includes:
   receiving the input signal;
   deriving the high frequency portion from the input signal;
   processing the high frequency signal by an amplifier; and
   providing a high frequency driving signal output from the amplifier.

22. The method of claim 21 wherein deriving a high frequency signal from the input signal includes processing the input signal by a high pass filter.

23. The method of claim 21 wherein the amplifier is configured to operate as a buffer.

24. The method of claim 20 wherein providing a low frequency driving signal includes:
   receiving the input signal;
   deriving the low frequency portion from the input signal;
   processing the low frequency signal by an amplifier; and
   providing a low frequency driving signal output from the amplifier.

25. The method of claim 24 wherein deriving a low frequency signal from the input signal includes processing the input signal by a low pass filter.

26. The method of claim 24 wherein the amplifier is configured to operate as a buffer.

27. The method of claim 19 wherein driving an inductive load with the high frequency driving signal and the low frequency driving signal includes:
   providing a transformer having a mutual inductance ratio;
   receiving a low frequency driving signal on one terminal of a secondary coil of the transformer;
   receiving a high frequency driving signal on a primary coil of the transformer; and
   providing a combined output signal to a load, the load coupled to a second terminal of the secondary coil, the combined output signal comprising the summation of the high frequency driving signal multiplied by the mutual inductance ratio and the low frequency signal.

28. The method of claim 27 wherein the load is an inductive load.

29. The method of claim 19 further comprising:
providing a current sensor device coupled to the inductive load.

30. The method of claim 19 wherein providing a high frequency driving signal includes reducing a noise signal, the noise signal present within the high frequency signal processed by the amplifier.

31. The method of claim 30 wherein reducing the noise signal includes providing a short to connect the high frequency signal to ground.

32. The method of claim 27 wherein providing a combined output signal includes reducing a noise signal, the noise signal present in the high frequency driving signal.

33. The method of claim 32 wherein reducing the noise signal includes providing a short to connect the low frequency driving signal to the load.

34. The method of claim 27 wherein receiving a high frequency driving signal on a secondary coil of the transformer includes:
providing a first high frequency driving signal to a end of the primary coil; and
providing a second high frequency driving signal to a end of the primary coil, the first high frequency driving signal being 180° out of phase with the second high frequency driving signal.

35. The method of claim 19 further comprising:
limiting the voltage applied to the inductive load.

36. The method of claim 35 wherein limiting the voltage applied to the inductive load includes providing a low pass further to limit the frequency band applied to the inductive load.

37. The method of claim 17 wherein processing the high frequency signal by an amplifier includes applying a first open loop to the high frequency signal.

38. The method of claim 21 wherein processing the high frequency signal by an amplifier includes providing a gain circuit having a first open loop gain.

39. The method of claim 24 wherein processing the low frequency signal by an amplifier includes providing a gain circuit having a second open loop gain.

40. A method for driving an inductive load comprising:
receiving an input signal;
amplifying the input signal;
separating a low frequency component from the input signal;
providing the low frequency component to a secondary coil of a transformer;
separating a high frequency component from the input signal;
providing the high frequency component to a primary coil of the transformer;
generating a driving signal by combining the high frequency component and low frequency component at the transformer; and
driving a load with the driving signal.

41. A system for measuring a signal comprising:
an amplifier operable to receive a signal having a voltage and provide an amplified output;
a high frequency driver having a high pass frequency response, the high frequency driver operable to receive the amplified output and provide a high frequency driving signal;
a low frequency driver having a low pass frequency response the low frequency driver operable to receive the amplified output and provide a low frequency driving signal; and
a transformer, the low frequency driving signal coupled to the secondary coil of the transformer, the high frequency driving signal coupled to the primary coil of the transformer, said transformer providing a combined output signal.

42. The system of claim 41 wherein said high frequency driver includes:
a high pass filter operable to receive the amplified output and provide a filtered output; and
a high frequency amplifier operable to receive the filtered output and provide a high frequency driving signal.

43. The system of claim 41 wherein said low frequency driver includes:
a low pass filter operable to receive the amplified output and provide a filtered output; and
a low frequency amplifier operable to receive the filtered output and provide a low frequency driving signal.

* * * * *